(12) United States Patent
Yang

(10) Patent No.: US 7,292,436 B2
(45) Date of Patent: Nov. 6, 2007

(54) HEAT DISSIPATING STRUCTURE APPLICABLE TO A COMPUTER HOST

(75) Inventor: Chun-Ying Yang, Taipei (TW)

(73) Assignee: Inventec Corporation (TW)

( * ) Notice: Subject to any disclaimer, the term of this patent is extended or adjusted under 35 U.S.C. 154(b) by 0 days.

(21) Appl. No.: 11/394,976

(22) Filed: Mar. 30, 2006

(65) Prior Publication Data

US 2007/0153475 A1 Jul. 5, 2007

(51) Int. Cl.
H05K 7/20 (2006.01)
H05K 5/00 (2006.01)
F03D 11/04 (2006.01)

(52) U.S. Cl. ............ 361/695; 165/80.3; 454/184; 361/825; 415/213.1

(58) Field of Classification Search ........ 361/694–695, 361/825, 831; 165/80.3; 415/213.1; 454/184
See application file for complete search history.

(56) References Cited

U.S. PATENT DOCUMENTS

| | | | | |
|---|---|---|---|---|
| 6,215,659 B1 * | 4/2001 | Chen | | 361/695 |
| 6,236,564 B1 * | 5/2001 | Fan | | 361/695 |
| 6,343,011 B1 * | 1/2002 | Yu | | 361/695 |
| 6,343,014 B1 * | 1/2002 | Lin | | 361/697 |
| 6,464,578 B1 * | 10/2002 | Chin et al. | | 454/184 |
| 6,616,525 B1 * | 9/2003 | Giraldo et al. | | 454/184 |
| 6,722,971 B2 * | 4/2004 | Gough | | 454/187 |
| 6,731,502 B1 * | 5/2004 | Hsu | | 361/695 |
| 6,817,939 B2 * | 11/2004 | Gan et al. | | 454/184 |
| 6,826,048 B1 * | 11/2004 | Dean et al. | | 361/695 |
| 6,930,882 B2 * | 8/2005 | Broder et al. | | 361/695 |
| 7,031,157 B2 * | 4/2006 | Horng et al. | | 361/695 |
| 7,156,611 B2 * | 1/2007 | Oosawa et al. | | 415/68 |
| 7,168,912 B2 * | 1/2007 | Sun | | 415/66 |
| 2004/0004812 A1 * | 1/2004 | Curlee et al. | | 361/687 |
| 2004/0095723 A1 * | 5/2004 | Tsai et al. | | 361/695 |
| 2006/0104028 A1 * | 5/2006 | Patel et al. | | 361/695 |
| 2006/0210398 A1 * | 9/2006 | Lin | | 415/220 |

FOREIGN PATENT DOCUMENTS

| | | | |
|---|---|---|---|
| EP | 1247989 A2 | * | 10/2002 |
| JP | 11068364 A | * | 3/1999 |
| KR | 2002037877 A | * | 5/2002 |
| KR | 2003069611 A | * | 8/2003 |
| KR | 2005109175 A | * | 11/2005 |
| KR | 2006030727 A | * | 4/2006 |
| WO | WO 9304289 A1 | * | 3/1993 |

* cited by examiner

Primary Examiner—Michael Datskovskiy
Assistant Examiner—Robert J. Hoffberg
(74) Attorney, Agent, or Firm—Peter F. Corless; Steven M. Jensen; Edwards Angell Palmer & Dodge LLP

(57) ABSTRACT

A heat dissipating structure for a computer host is disclosed. The heat dissipating structure is fixable to a housing of the computer host and is provided for a heat dissipating fan for dissipating heat. The heat dissipating structure includes a fan fixing housing including a front opening and a hollow network, the fan fixing housing being a hollow frame; a plurality of first fixing portions formed in a peripheral region around the front opening of the fan fixing housing; and a plurality of second fixing portions corresponding to the first fixing portions and formed on a peripheral region of the hollow network of the fan fixing housing.

13 Claims, 3 Drawing Sheets

HEAT DISSIPATING STRUCTURE APPLICABLE TO A COMPUTER HOST

BACKGROUND OF THE INVENTION

1. Field of the Invention

This invention relates to heat dissipating structures for a computer host, and more particularly, to a heat dissipating structure for a plurality of heat dissipating fans to be stacked on and improving a heat dissipating efficiency.

2. Description of Related Art

In general, a computer comprises a housing, a motherboard, a central processing unit (CPU), a hard driver, a power supply, and a heat dissipating structure. The heat dissipating structure is used for dissipating heat generated by the CPU, the hard driver and the power supply to a region outside of the housing, so as to lower the temperature in the housing and ensure the CPU, the hard driver and the power supply can function normally. Some heavy-load computers have to comprise two heat dissipating structures, because at least one of the two heat dissipating structures can still work to lower the temperature, even if the other is malfunctioned.

The two heat dissipating structures of the prior art are integrated into an integral module. Therefore, if one of the heat dissipating structures is malfunctioned, the whole integral module is useless and has to be replaced with a new one.

Moreover, the two heat integrating modules of the integral module can not work independently, and still work concurrently even though the computer generates too less the heat in a specific application.

Therefore, it becomes one of the most issues in the art to provide a heat dissipating structure which can be stacked on another heat dissipating structure, so as to overcome the drawback of the integral module.

SUMMARY OF THE INVENTION

In views of the above-mentioned problems of the prior art, it is a primary objective of the present invention to provide a heat dissipating structure for a computer host. The heat dissipating structure can be easily fixed to or detached from the computer host, without the use of any tool.

It is another objective of the present invention to provide heat dissipating structure for a computer host. The computer host can be provided with only one or more than one heat dissipating structure of the present invention in accordance to varieties of applications.

To achieve the above-mentioned and other objectives, a heat dissipating structure is provided according to the present invention. The heat dissipating structure is applicable to a computer host. The heat dissipating structure is fixable to a housing and provides for a heat dissipating fan for dissipating heat. The heat dissipating structure includes a fan fixing housing comprising a front opening and a hollow network, the fan fixing housing being a hollow frame; a plurality of first fixing portions formed in a peripheral region around the front opening of the fan fixing housing; and a plurality of second fixing portions corresponding to the first fixing portions and formed on a peripheral region of the hollow network of the fan fixing housing.

The fan fixing housing further includes a plurality of positioning plates installed on the front opening and a plurality of positioning slots corresponding to the positioning plates and installed on the front opening, and the housing comprises a plurality of through holes corresponding to the positioning plates and the positioning slots, enabling the fan fixing housing to be engaged with the housing by engaging the positioning plates and the positioning slots with the through holes of the housing. The fan fixing housing is fixed to another fan fixing housing by engaging the first fixing portions with second fixing portions of the another fan fixing housing. The fan fixing housing further includes a first auxiliary fixing portion and a second auxiliary fixing portion corresponding to the first auxiliary fixing portion, enabling the fan fixing housing to be engaged with another fan fixing housing by engaging the first auxiliary fixing portion with the second auxiliary fixing portion. Likewise, the heat dissipating structure can be stacked with a plurality of heat dissipating fans to promote or reduce a heat dissipating efficiency.

The fan fixing housing further includes a fan and an electric motor for providing flowing air. Therefore, at least two fan fixing housings has to be stacked on each other, so as to promote the heat dissipating efficiency and prevent a system from crash due to the malfunction of a single fan. Moreover, some fan fixing housings can be detached if they are unnecessary, so as to save power.

Another embodiment of the present invention installs an air guiding mask on a surface of the hollow network of the fan fixing housing to guide and conduct to another direction. The air guiding mask includes a mask fixture for engaging the air guiding mask with the fan fixing housing by engaging the mask fixture with the second fixing portions of the fan fixing housing.

Moreover, the first fixing portion is preferably a fixing plate. The second fixing portion, which corresponds to the first fixing portion, is a fixing hole. The fan fixing housing can be engaged with another fan fixing housing by engaging the fixing plate with the fixing hole and engaging the first auxiliary fixing portion with the second auxiliary fixing portion. The fan fixing housing can be installed on the housing by engaging the positioning plates and positioning slots with through holes of the housing.

Moreover, if the first fixing portion is a fixing hole, and the second fixing portion is a fixing plate corresponding to the first fixing portion, the objective to engaging the first fixing portion with the second fixing portion can also be obtained.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

Figure 1:
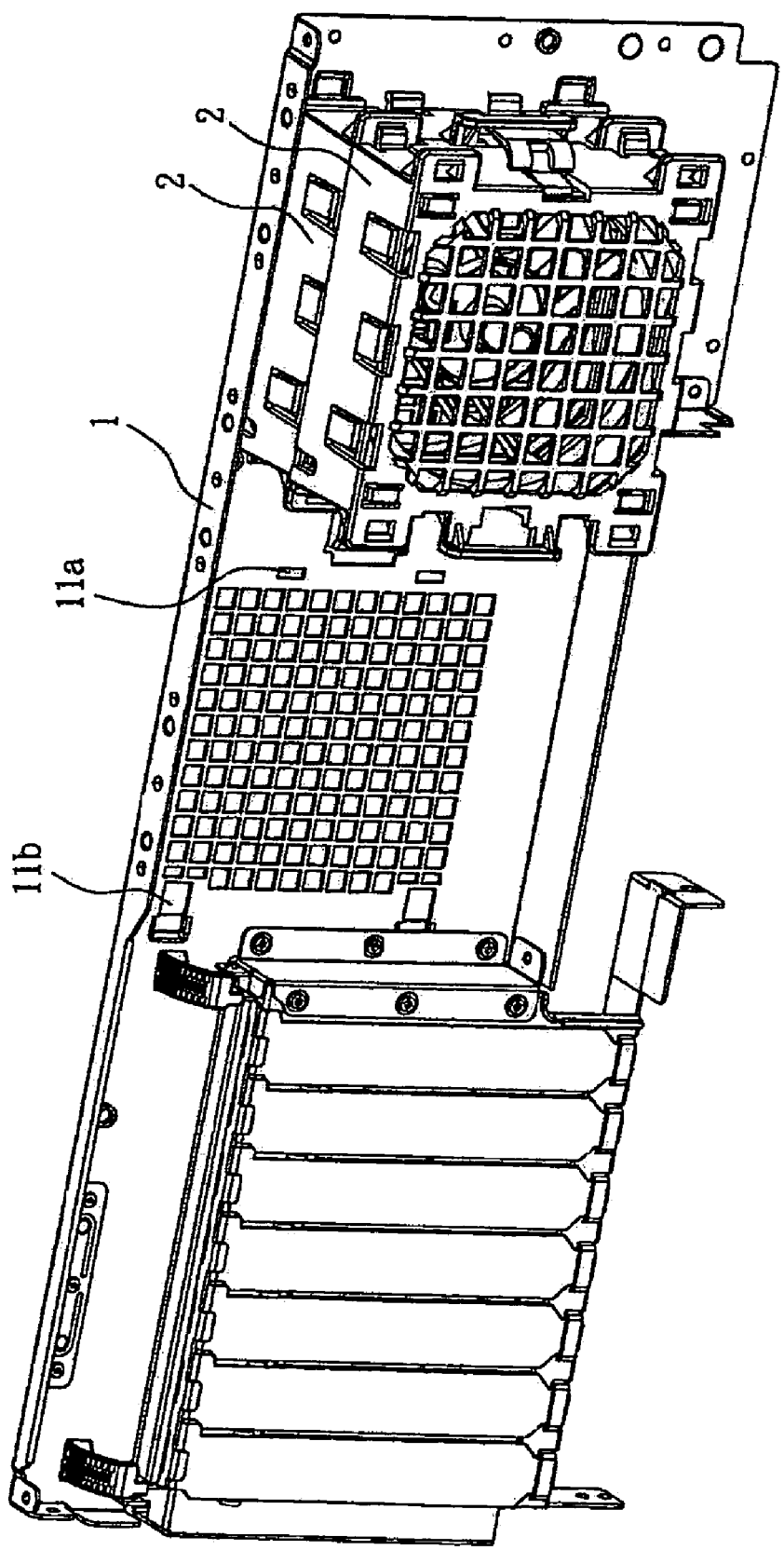
FIG. 1 is a schematic diagram of a housing and a heat dissipating fan of a heat dissipating structure for a computer host of the present invention.

FIG. 1 is a schematic diagram of a heat dissipating structure for a computer host. The heat dissipating structure is installed on a housing 1 for providing a heat dissipating fan 2 to dissipate heat. Please refer to FIGS. 2A and 2B. The heat dissipating fan 2 installs a fan (not shown) and a electric motor 22 in a fan fixing housing 21 which is a hollow frame for providing flowing air. The fan fixing housing 21 comprises a front opening 21a and a hollow network 21b opposite to the front opening 21a. A peripheral region of the front opening 21a of the fan fixing housing 21 comprises a plurality of first fixing portions 23 such as fixing plates. A plurality of second fixing portions 24 such as fixing holes corresponding to the first fixing portions 23 are formed in a peripheral region of the hollow network 21b of the fan fixing housing 21. The fan fixing housing 21 can be engaged with another fan fixing housing 21' by engaging the first fixing portions 23 of the fan fixing housing 21 with second fixing portions 24 of the another fan fixing housing 21', as shown in FIG. 3.

The first fixing portion 23 can also be a fixing hole, and the second fixing portion 24 can also be a corresponding fixing plate.

Figure 2A:
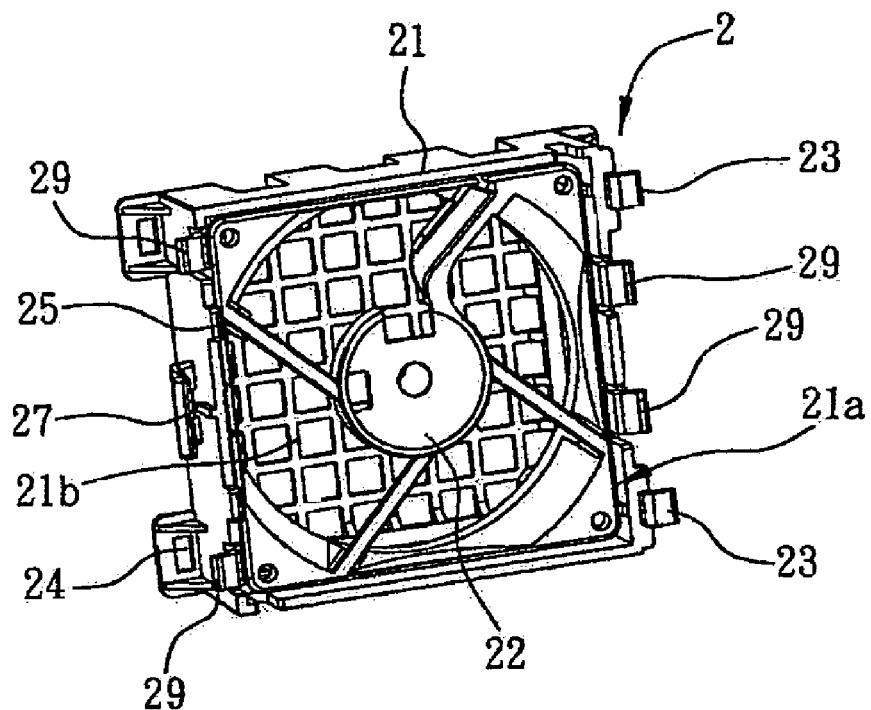
FIG. 2A is a front view of the heat dissipating fan of the heat dissipating structure for a computer host of the present invention.
Figure 2B:
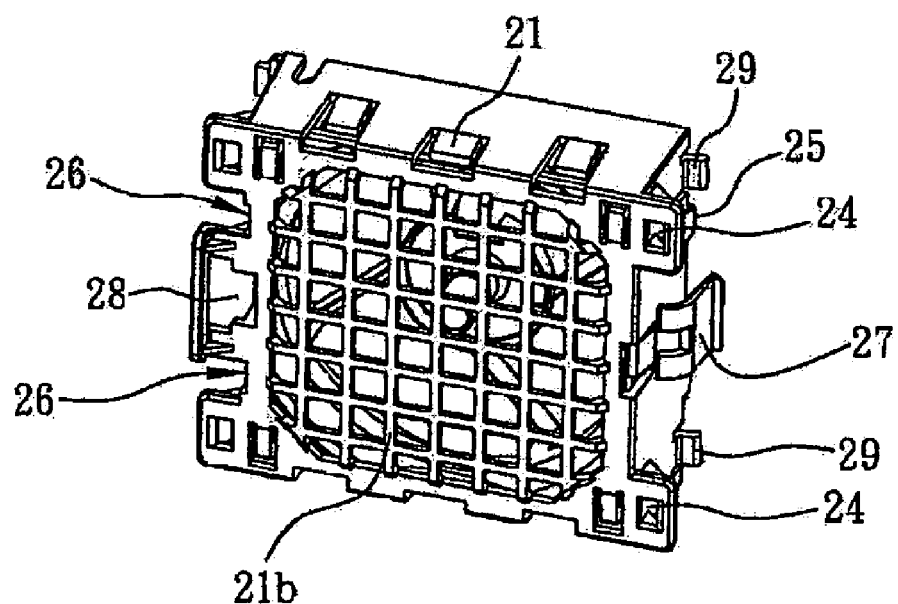
FIG. 2B is a rear view of the heat dissipating fan of the heat dissipating structure for a computer host of the present invention.

Please refer to FIGS. 1, 2A and 2B again. The fan fixing housing 21 further comprises a plurality of positioning plates 25 installed on the front opening 21a, and a plurality of positioning slots 26 installed on the front opening 21a and corresponding to the positioning plates 25, as shown in FIGS. 2A and 2B, to position the stacked and engaged fan fixing housings 21, 21' first, and perform a fixing process by the above-mentioned first and second fixing portions 23, 24. The housing 1 comprises a plurality of through holes 11a, 11b corresponding to the positioning plates 25 and the first fixing portions 23, enabling the positioning plates 25 of the fan fixing housing 21 to be inserted into the through hole 11a of the housing 1 first, and enabling the first fixing portions 23 of the fan fixing housing 21 to be mounted onto the other through hole 11b of the housing 1, so as to engage the fan fixing housing 21 with the housing 1.

Figure 3:
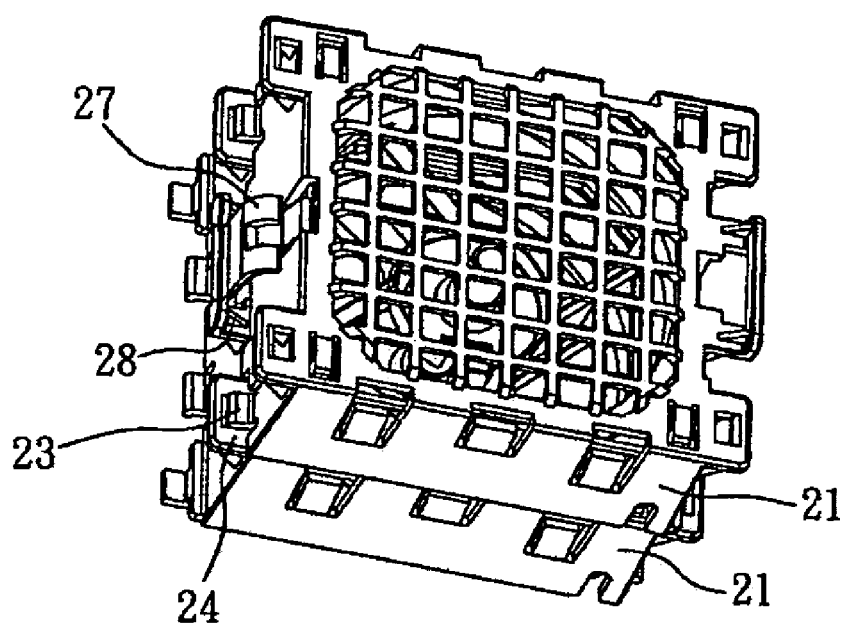
FIG. 3 is a schematic diagram of two heat dissipating fans of the heat dissipating structure for a computer host of the present invention.

Please refer to FIGS. 2A, 2B and 3. The fan fixing housing 21 further comprises at least a first auxiliary fixing portion 27, and a second auxiliary fixing portion 28 corresponding to the first auxiliary fixing portion 27, as shown in FIGS. 2A and 2B. The fan fixing housing 21 can be engaged with the another fan fixing housing 21' by engaging the first auxiliary fixing portion 27 with the second auxiliary fixing portion 28. In addition to the engagement of the first fixing portions 23 and the second fixing portions 24 of the another fan fixing housing 21', the fan fixing housing 21 can be engaged with the fan fixing housing 21' further by engaging the first auxiliary fixing portion 27 with a second auxiliary fixing portion 28 of the fan fixing housing 21', so as to strengthen the engagement of the fan fixing housing 21 and the another fan fixing housing 21', as shown in FIG. 3.

The front opening 21a of the fan fixing housing 21 further comprises a plurality of shock-proof elastic plates 29 for absorbing any shook induced by unexpected external forces imposed on the fan fixing housing 21 by suppressing themselves against an outer wall of the another fan fixing housing 21' when the fan fixing housing 21 is engaged with the another fan fixing housing 21'. Moreover, when the fan fixing housing 21 is engaged with the housing 1 by the use of the positioning plates 25 and the first fixing portions 23, the shook-proof elastic plates 29 are leaning against the housing and absorb the shook and prevent from generating noises.

Figure 4:
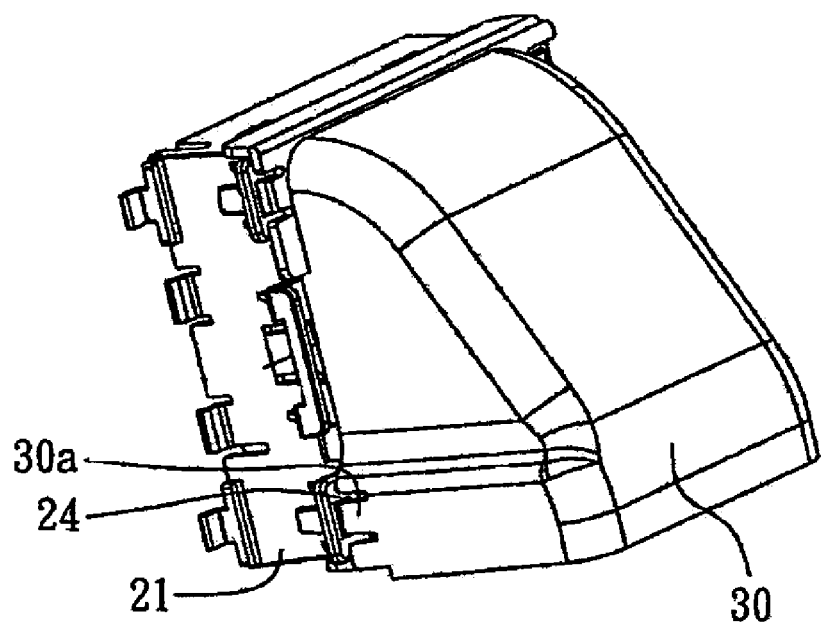
FIG. 4 is a schematic diagram of the heat dissipating fan of the heat dissipating structure for a computer host and a air guiding mask mounted on the heat dissipating fan.

Please refer to FIG. 4. An air guiding mask 30 is further engaged with a surface of the hollow network 21b of the fan fixing housing 21. The air guiding mask 30 comprises a mask fixture 30a, enabling the air guiding mask 30 to be engaged with the fan fixing housing 21 by engaging the mask fixture 30a with the second fixing portions 24 of the fan fixing housing 21, and guiding air to another direction or absorb heat to dissipate heat through the air guiding mask 30.

With the first fixtures 23, the second fixing portions 24, the first auxiliary fixing portion 27 and the second auxiliary fixing portion 28, the fan fixing housing 21 can be fixed to the another fan fixing housing 21' tightly in a stacked manner. Likewise, a plurality of fan fixing housings 21 can be stacked on one another to form the heat dissipating fan 2, which perform a well heat dissipating efficiency. On the other hand, unnecessary fan fixing housings 21 can be detached from the fan dissipating fan 2 in response to different heat dissipating needs, so as to solve the drawbacks of the prior art having an integrated structure and lacking variability.

Moreover, because the fan fixing housing 21 can be engaged with the fan fixing housing 21' by the first and second fixing portions 23 and 24, and the first and second auxiliary fixing portions 27 and 28, tools are not needed.

Further, the air guiding mask 30 guides air to another location, and guides cool air to a high heat to dissipate or absorb heat.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A heat dissipating structure for a computer host, the heat dissipating structure being fixable to a housing of the computer host and provided for a heat dissipating fan for dissipating heat, the heat dissipating structure comprising:
a fan fixing housing comprising a front opening and a hollow network, the fan fixing housing being a hollow frame;
a plurality of first fixing portions formed in a peripheral region around the front opening of the fan fixing housing; and
a plurality of second fixing portions corresponding to the first fixing portions and formed on a peripheral region of the hollow network of the fan fixing housing,
wherein the front opening of the fan fixing housing further comprises a plurality of shock-proof elastic plates for absorbing shocks by leaning against an outer wall of another fan fixing housing when the fan fixing housing is engaged with the another fan fixing housing.

2. The heat dissipating structure of claim 1, wherein the fan fixing housing further comprises a fan and an electric motor for providing flowing air.

3. The heat dissipating structure of claim 1, wherein the fan fixing housing further comprises a plurality of positioning plates installed on the front opening, and a plurality of positioning slots corresponding to the positioning plates and installed on the front opening, and the housing of the computer host comprises a plurality of through holes corresponding to the positioning plates and the first fixing portions, allowing the fan fixing housing to be engaged with the housing of the computer host by engaging the positioning plates and the first fixing portions with the through holes of the housing.

4. The heat dissipating structure of claim 1, wherein the fan fixing housing is fixed to another fan fixing housing by engaging the first fixing portions with second fixing portions of the another fan fixing housing.

5. The heat dissipating structure of claim 4, wherein the fan fixing housing further comprises a first auxiliary fixing portion and a second auxiliary fixing portion corresponding to the first auxiliary fixing portion, allowing the fan fixing housing to be engaged with the another fan fixing housing by engaging the first auxiliary fixing portion with the second auxiliary fixing portion.

6. The heat dissipating structure of claim 5, wherein the first auxiliary fixing portion is a fixing plate.

7. The heat dissipating structure of claim 6, wherein the second auxiliary fixing portion is a fixing hole corresponding to the first auxiliary fixing portion.

8. The heat dissipating structure of claim 1 further comprising an air guiding mask.

9. The heat dissipating structure of claim 8, wherein the air guiding mask comprises a mask fixture for engaging the air guiding mask with the fan fixing housing by engaging the mask fixture with the second fixing portions.

10. The heat dissipating structure of claim 1, wherein at least one of the first fixing portions is a fixing plate.

11. The heat dissipating structure of claim 10, wherein at least one of the second fixing portions is a fixing hole corresponding to the fixing plate.

12. The heat dissipating structure of claim 1, wherein at least one of the first fixing portions is a fixing hole.

13. The heat dissipating structure of claim 12, wherein at least one of the second fixing portions is a fixing plate corresponding to the fixing hole.

* * * * *